US006255890B1

United States Patent
Aiello et al.

(10) Patent No.: US 6,255,890 B1
(45) Date of Patent: *Jul. 3, 2001

(54) CIRCUIT FOR CONTROLLING THE SWITCHING OF A LOAD BY MEANS OF AN EMITTER-SWITCHING DEVICE

(75) Inventors: Natale Aiello, Catania; Atanasio La Barbera, Mascalucia-Catania, both of (IT)

(73) Assignee: STMicroelectronics S.r.l., Agrate Brianza (IT)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/314,924

(22) Filed: May 19, 1999

(30) Foreign Application Priority Data

May 21, 1998 (EP) .................................................. 98830311

(51) Int. Cl.[7] ......................... H03K 17/60; H03K 17/687
(52) U.S. Cl. ............................................. 327/432; 327/433
(58) Field of Search .................................. 327/432, 433, 327/365, 376, 377

(56) References Cited

U.S. PATENT DOCUMENTS 4,740,722 * 4/1988 Furuhata .............................. 327/432

FOREIGN PATENT DOCUMENTS

| 2 592 750 | 12/1986 | (FR) . |
| 2 105 927 | 7/1981 | (GB) . |
| 401108810A | * 4/1989 | (JP) ...................................... 327/432 |

OTHER PUBLICATIONS

Horn, W. Liestungs–Mosfet Potentialfrei Angesteuert, Electronik, vol. 32 No. 12, Jun. 16 1983, p. 67.

* cited by examiner

Primary Examiner—Dinh T. Le
(74) Attorney, Agent, or Firm—Theodore E. Galanthay; Allen, Dyer, Doppelt, Milbrath & Gilchrist, P.A.

(57) ABSTRACT

A circuit controls switching of a load between two supply terminals by a device in an emitter-switching configuration formed by a high-voltage bipolar power transistor and a low-voltage switch element. The bipolar power transistor has a collector connected to the load. The switch element has a first terminal connected to the emitter of the bipolar power transistor, a second terminal connected to ground, and a control terminal connected to a control terminal of the circuit. The circuit has a biasing circuit connected to a base terminal of the bipolar power transistor. To ensure that the bipolar power transistor operates in the saturation region throughout the period of conduction, even with a sinusoidal driving voltage, the biasing circuit includes a capacitive device and a charging circuit for charging the capacitive device to bias the base of the bipolar power transistor.

24 Claims, 4 Drawing Sheets

CIRCUIT FOR CONTROLLING THE SWITCHING OF A LOAD BY MEANS OF AN EMITTER-SWITCHING DEVICE

FIELD OF THE INVENTION

The present invention relates to the field of electronics, and, more particularly, to a switch.

BACKGROUND OF THE INVENTION

A typical device in an emitter-switching configuration is formed by a bipolar power transistor for high voltage use, and by a field-effect transistor for high frequency and low voltage use. These two transistors are connected to one another with the emitter terminal of the former connected to the drain terminal of the latter. The former component is selected to withstand high voltages, and the latter is selected to avoid the poor performance of the former during switching while in operation. A switch element of another type, for example, a bipolar transistor for high frequency and low voltage use may be used instead of the field-effect transistor.

Typically, the high-voltage transistor has an open-emitter collector-base breakdown voltage (BVcbo) which may be up to 2000V, whereas the low-voltage transistor has a breakdown voltage of about 60V. This configuration is advantageously used in circuits for controlling the switching of a load in which the switching speed is important. The operating frequency in this type of configuration may be several hundred kilohertz.

Various methods are known for operating a device in an emitter-switching configuration. Two of the most often used methods are shown in FIGS. 1 and 2. Referring to FIG. 1, the base terminal of the bipolar power transistor Q and the gate terminal of the field-effect transistor M are driven by the same input signal Vin. The two terminals are separated by a resistor R1. Referring now to FIG. 2, only the gate terminal of the field-effect transistor M is driven by the input signal Vin, while the base terminal of the bipolar power transistor Q is connected to a constant voltage supply Vcc. This constant voltage supply Vcc, in many cases, is different from the voltage supply Vdd of the load RL.

The system of FIG. 1 is used without problems in all cases in which the driving signal Vin is a rectangular wave. However, the system is not very efficient if the waveform of the driving signal is sinusoidal. The system of FIG. 2 does not have this problem, but may require a voltage supply Vcc separate from the main supply Vdd for biasing the base of the bipolar power transistor. In certain applications, this additional supply has to be at a voltage higher than the main voltage. This creates circuit design problems, and complicates the circuit.

A sinusoidal input voltage signal Vin, as shown in FIG. 3a), and an inductive load RL are considered with reference to the system of FIG. 1.

The base current Ib is also sinusoidal, as shown in FIG. 3b), and the collector current Ic has a triangular waveform as shown in FIG. 3c). The maximum value of the base current occurs not when the collector current is at a maximum, but at a moment at which the collector current has a value below the maximum value. In these operating conditions, since collector current Ic flowing through the bipolar power transistor Q increases as the base current Ib decreases, its operating point may move from the saturation region to the active region, as shown in FIG. 4. This drawing shows the characteristic curves of the collector current Ic as a function of the voltage Vcs. The voltage Vcs is between the collector of the bipolar transistor Q and the source terminal of the field-effect transistor M for various values of the base current Ib.

Two operating points, indicated a and b, are shown in FIG. 4 and correspond to two collector-current values $Ic_1$, and $Ic_2$, respectively. The former is on a characteristic curve corresponding to a base current Ibn, and is in the saturation region of this curve. The saturation region is a low voltage Vcs1 of the collector relative to the ground terminal. The latter is on a characteristic curve corresponding to a base current Ibn-1 less than the current Ibn. This is in the active region of this curve, that is, at a high voltage $Vcs_2$ of the collector relative to ground.

The curve of the voltage Vcs between the collector and ground in the positive half-period of the input voltage Vin is shown in FIG. 3d). This method of driving the device in an emitter-switching configuration causes the bipolar power transistor Q to operate in the active region of its characteristic curve during part of the time during which it should function as a closed switch. This also causes an increase in the power dissipated Pdiss, as shown in FIG. 3e).

With the driving system of FIG. 2, the base current Ib also decreases as the collector current Ic increases during part of the time when the bipolar power transistor Q is conductive. However, the effects of this are negligible if the biasing voltage Vcc selected is significantly greater than the sum of the voltage drop Vbe between the base and the emitter of the bipolar transistor Q, and the voltage drop Vds between the drain and source terminals D and S of the field-effect transistor M.

SUMMARY OF THE INVENTION

An object of the present invention is to provide a circuit for controlling switching of a load by a device in an emitter-switching configuration. The device includes a bipolar power transistor operating in the saturation region throughout the time for which it is conductive, even with a sinusoidal driving voltage, and no additional power supplies are required.

This object is achieved, according to the present invention by a circuit in an emitter-switching configuration formed by a high-voltage bipolar power transistor and a low-voltage switch element. The bipolar power transistor has a collector connected to the load. The switch element has a first terminal connected to the emitter of the bipolar power transistor, a second terminal connected to ground, and a control terminal connected to a control terminal of the circuit. The circuit has a biasing circuit connected to a base terminal of the bipolar power transistor. To ensure that the bipolar power transistor operates in the saturation region throughout the period of conduction, even with a sinusoidal driving voltage, the biasing circuit includes a capacitive device and a circuit for charging the capacitive device to bias the base of the bipolar power transistor.

BRIEF DESCRIPTION OF THE DRAWINGS

The invention will be understood further from the following detailed description of three embodiments thereof given by way of non-limiting examples with reference to the appended drawings, in which.

DETAILED DESCRIPTION OF THE PREFERRED EMBODIMENTS

Figure 1:
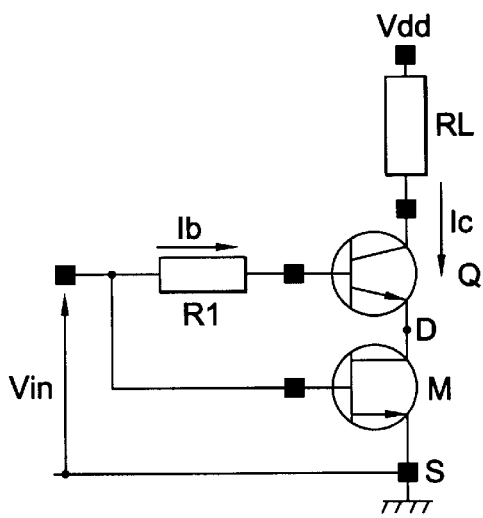
FIGS. 1 and 2 are two circuit diagrams which respectively show two methods of driving a device in an emitter-switching configuration according to the prior art.
Figure 2:
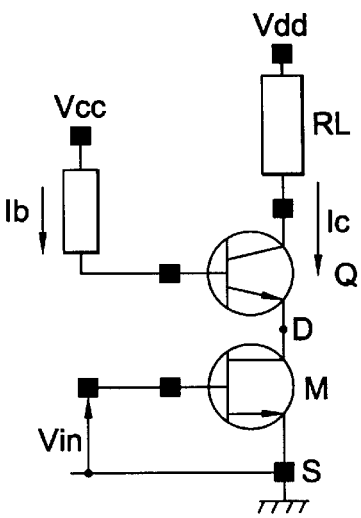
Figure 3A:
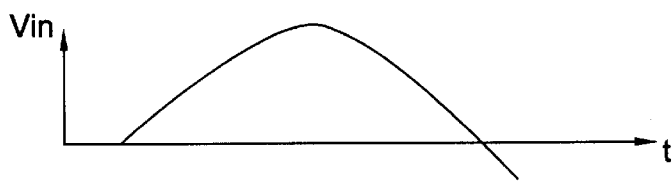
FIG. 3 shows graphs illustrating operation of the circuit of FIG. 1 when driven by a sinusoidal voltage as in the prior art.
Figure 3B:
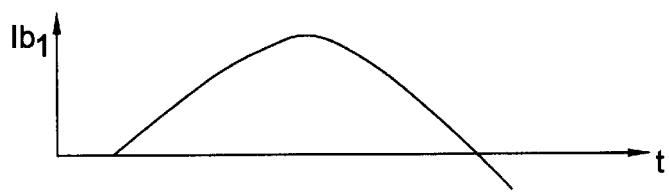
Figure 3C:
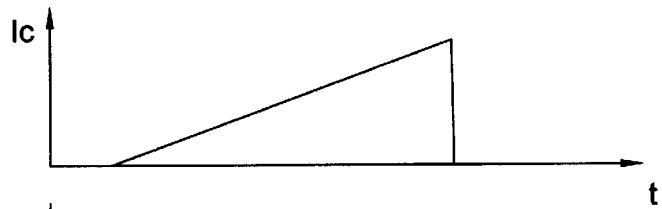
Figure 3D:
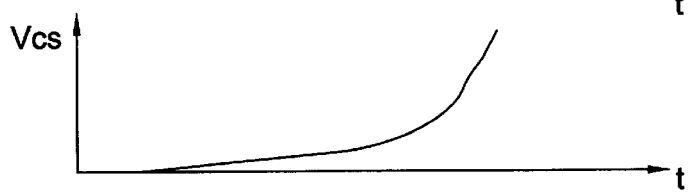
Figure 3E:
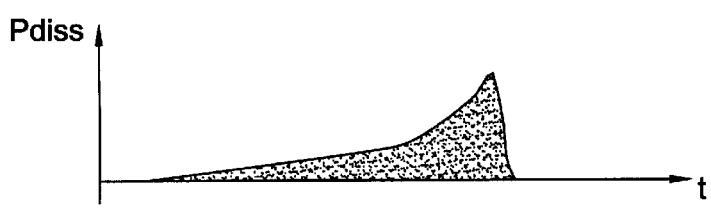
Figure 4:
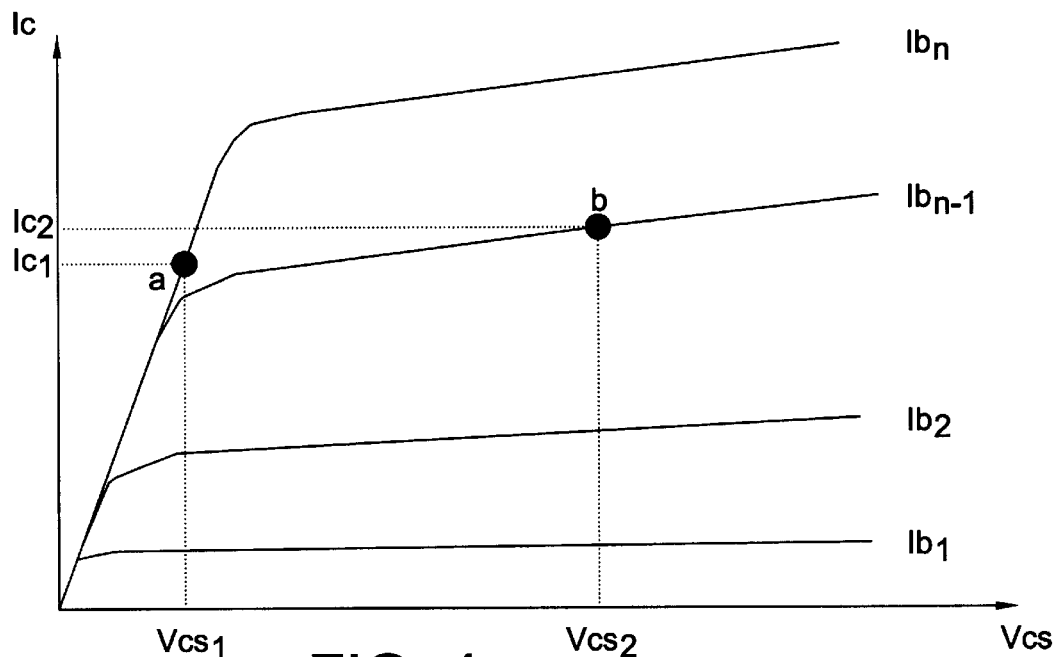
FIG. 4 shows characteristic current/voltage curves of the bipolar power transistor of the circuit of FIG. 1 as in the prior art.
Figure 5:
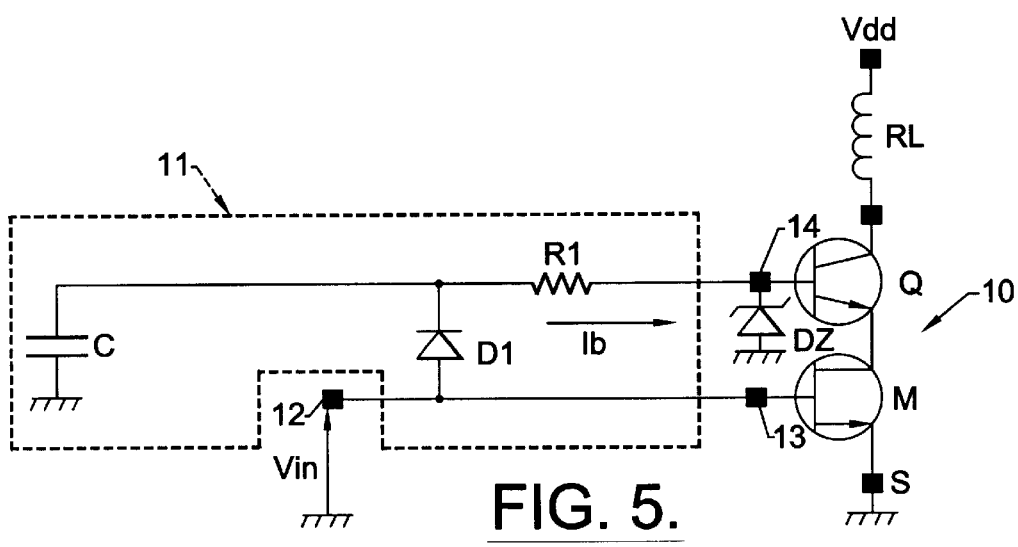
FIG. 5 is a circuit diagram according to a first embodiment of the present invention.

In FIG. 5, an emitter-switching device, generally indicated by reference 10, is formed by an npn bipolar transistor Q, and by an n-channel field-effect transistor M. The collector of the transistor Q is connected to a terminal of a load RL which, in this example, is an inductive load. The other terminal of the load RL is connected to a voltage supply Vdd. The source terminal S of the transistor M is connected to ground.

A circuit, generally indicated by reference 11, biases the base of the bipolar transistor Q and controls the switching of the device 10 responsive to a sinusoidal input voltage Vin. An input terminal 12 is connected to the gate terminal 13 of the transistor M and to the anode of a diode D1. A capacitor C is connected to a reference-voltage terminal, e.g., ground, and, to the base terminal 14 of the transistor Q via a resistor $R_i$ to supply a biasing voltage to the base of the transistor Q. The cathode of the diode D1 is connected to the point at which the capacitor C is connected to the resistor R1.

Figure 6:
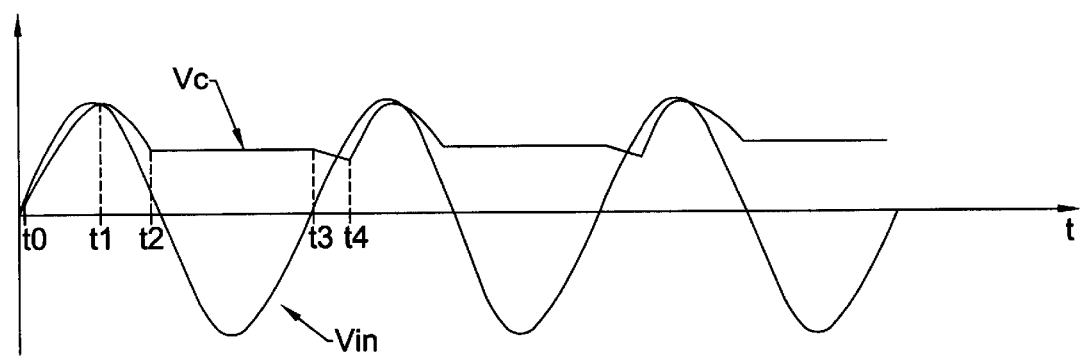
FIG. 6 is a graph illustrating operation of circuit of FIG. 5.

The operation of the circuit of FIG. 5 will now be considered with reference to the graph of FIG. 6, which shows the input voltage Vin and the voltage Vc across the capacitor C as functions of time. At time $t_0$ the capacitor C is discharged. As the voltage Vin increases, the capacitor C is charged through the diode D1, following the curve of Vin except for the drop in the diode D1 which is biased in the direction of conduction. As soon as the threshold voltage of the transistor M is exceeded, this transistor becomes conductive, allowing a current Ib to pass through the resistor R1 and the base-emitter junction of the transistor Q. The transistor Q also becomes conductive.

At time $t_1$, that is, shortly after the beginning of the trailing edge of the voltage Vin from the peak of the first positive half-wave, the voltages Vin and Vc are equal. Immediately afterwards, however, the voltage Vin falls more rapidly than the voltage Vc so that the diode D1 stops conducting. The charge for keeping the transistor Q conductive is now supplied by the capacitor C.

When the transistor M is cut off at time $t_2$, the transistor Q also stops conducting and the voltage Vc in the capacitor C remains substantially constant until, shortly after the start of the next positive half-wave, the transistors M and Q become conductive again at time $t_3$. The capacitor C still supplies a charge to the transistor Q until the voltage Vin exceeds the voltage Vc by a value equal to the conduction threshold of the diode D1 at time $t_4$. The voltage Vin starts charging the capacitor C and supplying the base of the transistor Q again, and the cycle is repeated.

To prevent over-voltages across the capacitor C due to the charge which accumulates in the base of the transistor Q, a Zener diode DZ is connected between the base and ground. This charge accumulates because of the current which passes through the collector-base junction for a short period of time, i.e., the storage time, immediately after the opening of the transistor M. The voltage across the capacitor C is thus limited to a predetermined value, that is, to the reverse conduction voltage of the diode DZ.

By selecting the circuit parameters, the above described circuit according to the present invention enables the bipolar power transistor to be kept in the saturation region throughout the time for which it is conductive. This is achieved without the use of additional power supplies. This is also achieved with a small number of components, all of which can be integrated in the same silicon chip containing the power device in an emitter-switching configuration, usually with the exception of the capacitor C. This circuit provides advantages in terms of costs and size.

In a practical embodiment of the invention, the capacitor C has a capacitance of 22 nF, the resistor R1 has a resistance of 700 ohms, the voltage Vin has a sinusoidal voltage of 30 Vpp at a frequency of 40 kHz, and the supply voltage Vdd is in a range of 300–400 V. To reduce the capacitance of the capacitor C and to reduce the overall size of the circuit, a device formed by two transistors connected in a Darlington configuration may be used instead of a single bipolar transistor Q. Two transistors connected in a Darlington configuration is well known by one skilled in the art.

Another embodiment of the invention which enables a higher mean voltage to be achieved across the capacitor is described below with reference to FIG. 7. In this figure, elements identical to those of FIG. 5 are indicated by the same reference numerals or symbols. The circuit differs from that of FIG. 5 by the addition of a diode D2 in parallel with the resistor R1, and by the addition of a Zener diode D3 in parallel with the capacitor C. This Zener diode D3 is used instead of the Zener diode DZ between the base of the transistor Q and ground. The diode D2 is oriented with its cathode connected to the cathode of the diode D1.

Figure 7:
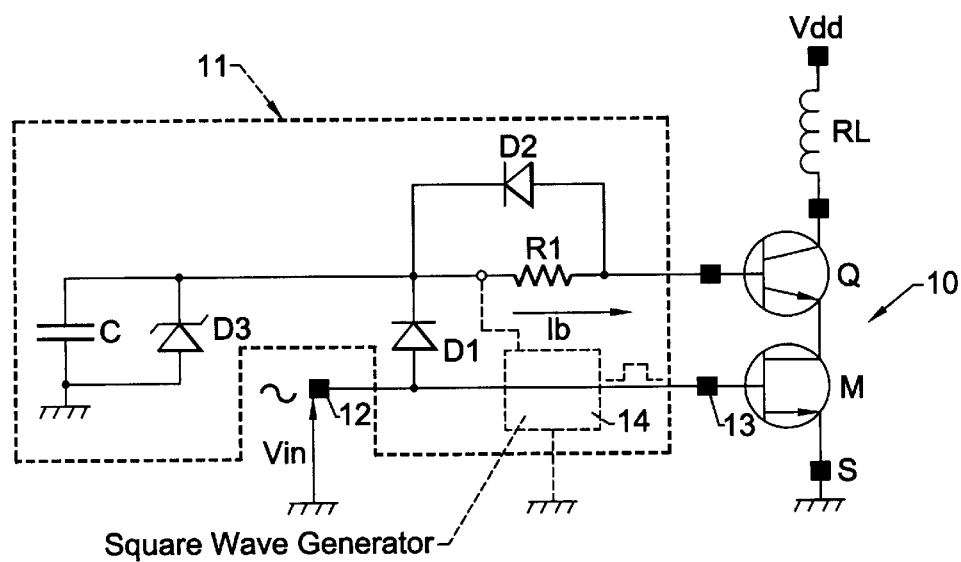
FIG. 7 is a circuit diagram according to a second embodiment of the present invention.
Figure 8:
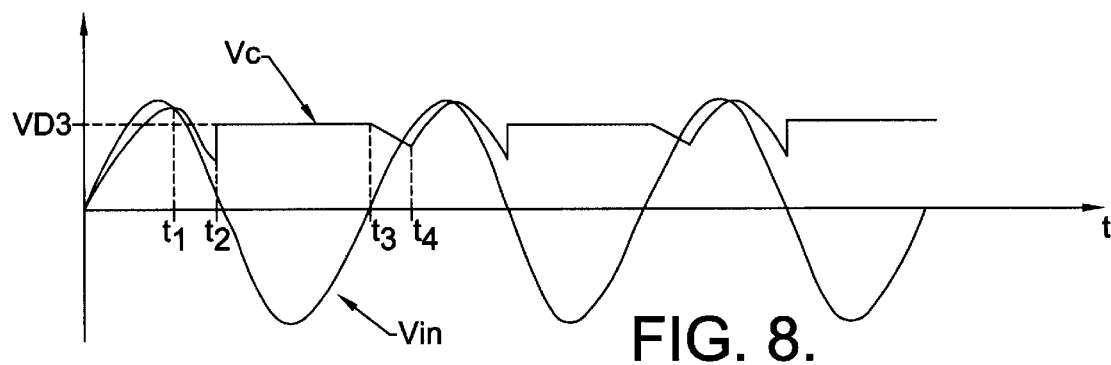
FIG. 8 is a graph illustrating operation of the circuit of FIG. 7.

As shown in the graph of FIG. 8, the circuit of FIG. 7 operates in a similar manner to that of FIG. 5 up to the time $t_2$, at which the transistor M is cut off. After this time, however, the behavior is different. In fact, after the transistor M is cut off, instead of being transferred to ground through a Zener diode (DZ in FIG. 5), the charges which accumulate in the base of the transistor Q are used, at least partially, to charge the capacitor C through the diode D2. The diode D2 is conductive only during this short period of time, i.e., the storage time of the transistor Q. The diode D2 is cut off in all other operative conditions of the circuit. The Zener diode D3 serves to limit the voltage Vc at the terminals of the capacitor C by transferring the excess charge to ground.

After the time $t_2$, the voltage Vc across the capacitor increases up to the reverse conduction voltage VD3 of the Zener diode D3 and remains substantially constant. The voltage remains constant even after the end of the storage time, and up to a time $t_3$ shortly after the start of the next positive half-wave when the transistors M and Q become conductive again. In a similar manner to the circuit of FIG. 5, the capacitor C supplies a charge to the transistor Q until the voltage Vin exceeds the voltage Vc by a value equal to the conduction threshold of the diode D1 at a time $t_4$. Afterwards, the voltage Vin starts to charge the capacitor C and to supply the base of the transistor Q again, and the cycle is repeated.

Figure 9:
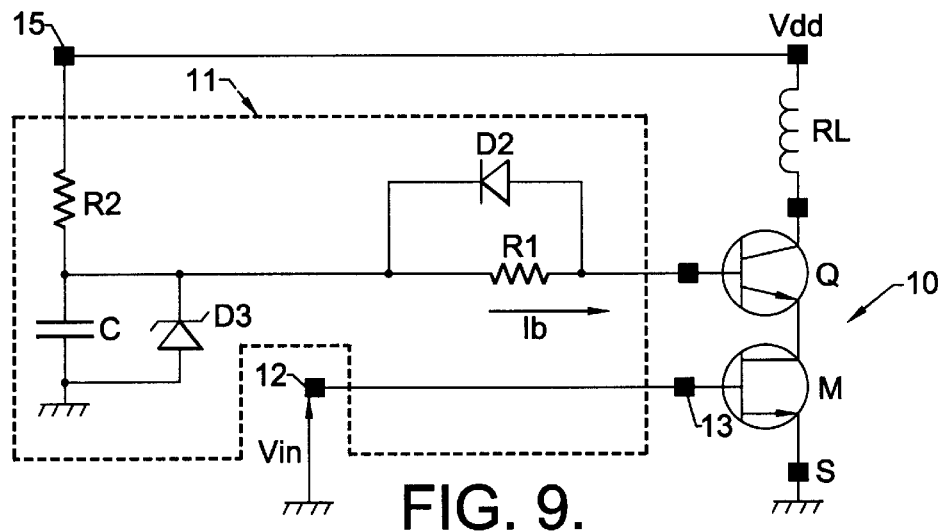
FIG. 9 is a circuit diagram according to a third embodiment of the present invention.

In order to speed up the switching of the device 10 in the circuit of FIG. 7, as may also be done in the circuits of FIG. 5 and 9, it may be advantageous to connect in series with the gate terminal of the transistor M a squaring circuit. The squaring circuit 14 is indicated by a dashed line bbox 14, and can advantageously be supplied by the voltage at the terminals of the capacitor C. A device in a Darlington configuration may also be used instead of the transistor Q in this embodiment.

In the embodiment of FIG. 9, elements identical or equivalent to those of FIG. 7 are indicated by the same reference numerals or symbols. In contrast with the circuit of FIG. 7, the capacitor C is not charged by the input voltage Vin because there is no diode D1. However, the capacitor C is charged through a resistor R2 by the supply voltage vdd supplied to a terminal 15, which may be called the biasing terminal. The resistor R2 may have a very large resistance, for example, 1–2 Mohms if Vdd is 300–400V and, therefore, dissipates a low power.

Figure 10:
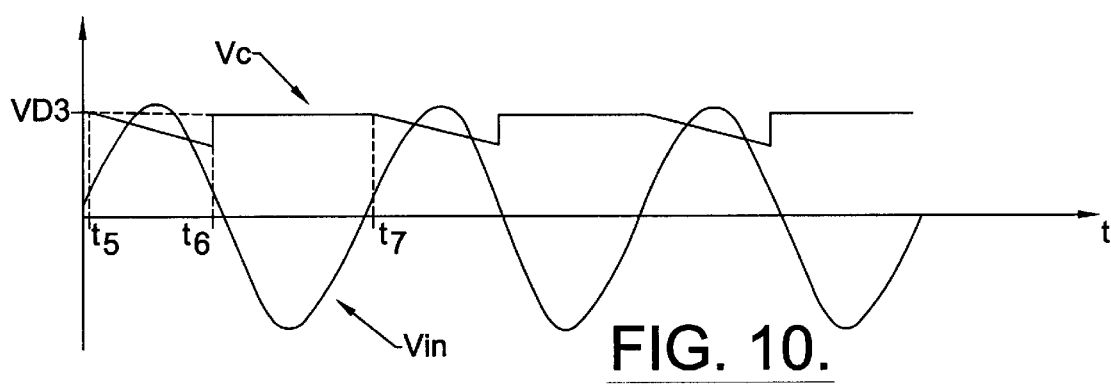
FIG. 10 is a graph showing operation of the circuit of FIG. 9.

In operation, as shown by the graph of FIG. 10, the capacitor C is initially charged to the voltage VD3. Immediately after time $t_5$, at which the input voltage Vin reaches the conduction threshold of the transistor M, that is, as soon as the transistor Q is conductive, the capacitor C supplies a charge to the base of the transistor Q. This enabling a current Ib to flow, bringing about and maintaining saturation in the transistor Q. The voltage Vc across the capacitor C thus falls until time $t_6$ when the transistor M is cut off. At this time, the charges which accumulate in the base as a result of the flow of current through the collector-base junction during saturation quickly recharges the capacitor C. Recharging is by the voltage of the Zener diode VD3 through the diode D2 in the direction of conduction. The capacitor remains charged to this voltage until the transistor M becomes conductive again at time $t_7$. This is immediately after the start of the next positive half-wave, and the cycle is repeated.

Although the embodiments described relate to the control of an inductive load, it will be clear to those skilled in the art that the circuit according to the present invention may also be used with the same advantages for controlling a resistive load, capacitive load, or mixed load.

That which is claimed is:

1. A circuit for controlling switching of a load comprising:
   a device in an emitter-switching configuration comprising
       a bipolar power transistor connected to a first voltage reference through the load,
       a switch element having a first terminal connected to said bipolar power transistor, and a second terminal connected to a second voltage reference, said switch element responsive to an input signal,
       a biasing circuit connected to said bipolar power transistor comprising a first resistive device connected to a base of said bipolar power transistor, and a capacitive device connected between said first resistive device and the second voltage reference, and
       a charging circuit for charging said capacitive device comprising a first diode connected between the control terminal of said switch element and a common node between said capacitive device and said first resistive device.

2. A circuit according to claim 1, wherein said charging circuit further comprises a second diode connected in parallel with said first resistive device.

3. A circuit according to claim 1, further comprising a voltage limiter connected in parallel with said capacitive device.

4. A circuit according to claim 3, wherein said voltage limiter comprises a Zener diode.

5. A circuit according to claim 1, wherein said switch element comprises a field-effect transistor.

6. A circuit according to claim 1, further comprising a square wave generator connected to a control terminal of said switch element.

7. A circuit according to claim 1, wherein the second voltage reference is ground.

8. A circuit for controlling switching of a load comprising:
   a device in an emitter-switching configuration comprising
       a bipolar power transistor connected to a first voltage reference through the load,
       a switch element having a first terminal connected to said bipolar power transistor, and a second terminal connected to a second voltage reference, said switch element responsive to an input signal,
       a first resistive device connected to a base of said bipolar power transistor,
       a capacitive device connected between said first resistive device and the second voltage reference for biasing said bipolar power transistor responsive to the input signal,
       a Zener diode connected in parallel with said capacitive device, and
       a charging circuit for charging said capacitive device responsive to the input signal, said charging circuit comprising a second resistive device connected to said capacitive device and to the first voltage reference, and a diode connected in parallel with said first resistive device.

9. A circuit according to claim 8, wherein the input signal is sinusoidal; and said capacitive device is charged during a positive half-wave cycle of the input signal and discharged during a negative half-wave cycle of the input signal.

10. A circuit according to claim 8, wherein said switch element comprises a field-effect transistor.

11. A circuit according to claim 8, further comprising a squaring circuit connected to a control terminal of said switch element.

12. A circuit according to claim 8, wherein the second voltage reference is ground.

13. A method for controlling switching of a load using a device in an emitter-switching configuration comprising a bipolar power transistor and a switch element, the method comprising the steps of:
   activating the switch element responsive to an input signal;
   charging a capacitive device responsive to the input signal for biasing the bipolar power transistor by conducting current through a first resistive device connected to a base of the bipolar power transistor and through a diode connected between a control terminal of the switch element and a common node between the capacitive device and the first resistive device; and
   discharging the capacitive device for biasing the bipolar power transistor responsive to the input signal.

14. A method according to claim 13, wherein the input signal is sinusoidal; and wherein the step of charging is performed during a positive half-wave cycle of the input signal; and wherein the step of discharging is performed during a negative half-wave cycle of the input signal.

15. A method according to claim 13, wherein the step of biasing further comprises conducting current through a second diode connected in parallel with the first resistive device.

16. A method according to claim 13, further comprising the step of limiting a voltage of the capacitive device.

17. A method according to claim 13, wherein biasing the bipolar power transistor further comprises conducting current through a second diode connected in parallel with the first resistive device; and wherein the step of charging comprises conducting current through a second resistive device connected between the capacitive device and a first voltage reference.

18. A method according to claim 17, further comprising the step of limiting the voltage of the capacitive device.

19. A method according to claim 13, wherein the switch element comprises a field-effect transistor.

20. A method according to claim 13, further comprising the step of supplying voltage from the capacitive device to a squaring circuit connected to a control terminal of the switch element.

21. A method for controlling switching of a load using a device in an emitter-switching configuration comprising a bipolar power transistor connected to a first voltage reference through the load, and a switch element connected to the bipolar power transistor and to a second voltage reference, the method comprising the steps of:

activating the switch element responsive to an input signal;

charging a capacitive device responsive to the input signal by conducting current through a diode connected in parallel with a first resistive device connected to a base of the bipolar power transistor, and by conducting current through a second resistive device connected to the capacitive device and to the first voltage reference;

limiting a voltage of the capacitive device using a Zener diode connected in parallel with the capacitive device; and discharging the capacitive device for biasing the bipolar power transistor responsive to the input signal.

22. A method according to claim 21, wherein the input signal is sinusoidal; and wherein the step of charging is performed during a positive half-wave cycle of the input signal; and wherein the step of discharging is performed during a negative half-wave cycle of the input signal.

23. A method according to claim 21, wherein the switch element comprises a field-effect transistor.

24. A method according to claim 21, further comprising the step of supplying voltage from the capacitive device to a squaring circuit connected to a control terminal of the switch element.

* * * * *

UNITED STATES PATENT AND TRADEMARK OFFICE
CERTIFICATE OF CORRECTION

PATENT NO. : 6,255,890 B1  
DATED : July 3, 2001  
INVENTOR(S) : Natale Aiello, Atanasio La Barbera Page 1 of 1

It is certified that error appears in the above-identified patent and that said Letters Patent is hereby corrected as shown below:

Column 3,
Line 35, delete "$R_i$" insert -- R1 --

Column 5,
Line 5, delete "bbox" insert -- box --

Signed and Sealed this

Twenty-second Day of January, 2002

Attest:

JAMES E. ROGAN
Attesting Officer
Director of the United States Patent and Trademark Office